United States Patent
Liu et al.

(10) Patent No.: US 11,302,230 B2
(45) Date of Patent: Apr. 12, 2022

(54) DISPLAY PANEL, DISPLAY DEVICE AND DISPLAY METHOD

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tingliang Liu, Beijing (CN); Weiyun Huang, Beijing (CN); Zhifeng Zhan, Beijing (CN); Yue Long, Beijing (CN); Yunsheng Xiao, Beijing (CN); Zhenxiao Tong, Beijing (CN); Hongwei Ma, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 524 days.

(21) Appl. No.: 16/330,194

(22) PCT Filed: Aug. 17, 2018

(86) PCT No.: PCT/CN2018/101019
§ 371 (c)(1),
(2) Date: Mar. 4, 2019

(87) PCT Pub. No.: WO2019/114309
PCT Pub. Date: Jun. 20, 2019

(65) Prior Publication Data
US 2021/0327320 A1 Oct. 21, 2021

(30) Foreign Application Priority Data
Dec. 15, 2017 (CN) .......................... 201711349933.1

(51) Int. Cl.
*G09G 5/02* (2006.01)
*G09G 3/20* (2006.01)
(Continued)

(52) U.S. Cl.
CPC ......... *G09G 3/20* (2013.01); *G02F 1/133308* (2013.01); *H01L 51/524* (2013.01);
(Continued)

(58) Field of Classification Search
USPC .......................... 345/690, 694, 156, 173, 174
See application file for complete search history.

(56) References Cited

U.S. PATENT DOCUMENTS

| 2014/0177268 A1 | 6/2014 | Zhou |
| 2016/0027356 A1* | 1/2016 | Cheng ..................... H01L 27/12 345/173 |
| 2016/0104441 A1 | 4/2016 | Lee et al. |
| 2017/0033164 A1* | 2/2017 | Liu ......................... G02B 5/223 |

(Continued)

FOREIGN PATENT DOCUMENTS

| CN | 103091739 A | 5/2013 |
| CN | 105093600 A | 11/2015 |

(Continued)

OTHER PUBLICATIONS

International Search Report and Written Opinion dated Nov. 1, 2018; PCT/CN2018/101019.

*Primary Examiner* — Thuy N Pardo

(57) ABSTRACT

Embodiments of the present disclosure provides a display panel, a display device and a display method. The display panel includes a display substrate and a package substrate, the display substrate includes a pixel region, the package substrate includes frames and a light transmission region surrounded by the frames, wherein a plurality of pixel units are disposed in the pixel region of the display substrate; a length L of the pixel region of the display substrate is greater than a distance D between the frames of the package (Continued)

substrate at least in a first direction; and an orthographic projection of the pixel region on the display substrate at least partially covers an orthographic projection of the light transmission region on the display substrate.

16 Claims, 6 Drawing Sheets

(51) Int. Cl.
*G02F 1/1333* (2006.01)
*H01L 51/52* (2006.01)
*H01L 27/32* (2006.01)

(52) U.S. Cl.
CPC ............... *G09G 2300/0439* (2013.01); *G09G 2360/147* (2013.01); *H01L 27/3244* (2013.01); *H01L 27/3281* (2013.01)

(56) References Cited

U.S. PATENT DOCUMENTS

| | | | |
|---|---|---|---|
| 2017/0038887 A1* | 2/2017 | Zhang | G02F 1/136227 |
| 2017/0053607 A1 | 2/2017 | Lin et al. | |
| 2017/0131584 A1* | 5/2017 | Liu | G02F 1/13336 |
| 2017/0276977 A1* | 9/2017 | Li | G02F 1/1333 |
| 2017/0309689 A1 | 10/2017 | Li | |
| 2017/0329193 A1* | 11/2017 | Wu | G02F 1/134336 |
| 2018/0158865 A1* | 6/2018 | Kimura | H01L 27/15 |
| 2019/0285952 A1* | 9/2019 | Ikegami | G02F 1/1368 |
| 2020/0020308 A1* | 1/2020 | Deering | H04N 9/3188 |
| 2020/0273936 A1* | 8/2020 | Yamazaki | H01L 29/66969 |
| 2021/0103307 A1* | 4/2021 | Tanaka | H01L 27/1255 |

FOREIGN PATENT DOCUMENTS

| | | |
|---|---|---|
| CN | 105511181 A | 4/2016 |
| CN | 105717687 A | 6/2016 |
| CN | 107831612 A | 3/2018 |
| JP | 2009-192994 A | 8/2009 |

\* cited by examiner

DISPLAY PANEL, DISPLAY DEVICE AND DISPLAY METHOD

The present application claims priority of Chinese Patent Application No. 201711349933.1 filed on Dec. 15, 2017, the disclosure of which is incorporated herein by reference in its entirety as part of the present application.

TECHNICAL FIELD

Embodiments of the present disclosure relate to a display panel, a display device and a display method.

BACKGROUND

The display panel, for example, may be applied to mobile phones, computers, televisions and other electronic products. At present, the display panel is developing towards large screen and no frame.

The manufacturing process of the display panel generally comprises: cell-assembling a display substrate provided with a plurality of pixel units and a package substrate, so that the package substrate is utilized to package functional structures such as the pixel units and a driving circuit on the display substrate. The package structure may be used for protecting various functional structures while making the display panel more beautiful.

SUMMARY

At least one embodiment of the present disclosure provides a display panel, comprising: a display substrate and a package substrate, the display substrate including a pixel region, the package substrate including frames and a light transmission region surrounded by the frames, wherein a plurality of pixel units are disposed in the pixel region of the display substrate; a length L of the pixel region of the display substrate is greater than a distance D between the frames of the package substrate at least in a first direction; and an orthographic projection of the pixel region on the display substrate at least partially covers an orthographic projection of the light transmission region on the display substrate.

For example, in the display panel provide by at least one embodiment of the present disclosure, in each direction, a length of the pixel region of the display substrate is greater than a distance between the frames disposed on both sides of the package substrate.

For example, in the display panel provide by at least one embodiment of the present disclosure, the pixel region includes a display region and a non-display region disposed at a periphery of the display region; and at least in the first direction, a length of the display region of the display substrate is L1, and the distance D between the frames on both sides of the package substrate and the length L1 satisfy a following relationship:

$$L1+P1 \geq D \geq L1;$$

in which P1 is a pitch of one pixel unit in the direction.

At least one embodiment of the present disclosure provides a display method for the display panel as mentioned above, which comprises determining the display region of the display substrate.

For example, in the display method provide by at least one embodiment of the present disclosure, the determining the display region of the display substrate includes: lighting up the pixel units in the pixel region; and determining the display region of the display substrate by detecting whether the pixel units in the pixel region are shielded by the frame when the pixel units are lighted up.

For example, in the display method provide by at least one embodiment of the present disclosure, the determining the display region of the display substrate includes: determining information of the pixel units disposed at a boundary of the display region of the display substrate.

For example, in the display method provide by at least one embodiment of the present disclosure, the information of the pixel unit includes row and/or column coordinate information or polar coordinate information.

For example, in the display method provide by at least one embodiment of the present disclosure, the plurality of pixel units are divided into a plurality of rows and a plurality of columns, the lighting up the pixel units in the pixel region includes: lighting up the pixel units in a portion of the plurality of rows or columns disposed at an edge on a side of the pixel region; and the determining the display region of the display substrate by detecting whether the pixel units in the pixel region are shielded when the pixel units are lighted up includes: detecting an acquired image of the display panel, determining a number of rows or columns of the pixel units which are shielded, and determining a number of rows or columns of the pixel units that are not lighted up in the acquired image; and determining a row number or a column number of the pixel units disposed at the boundary according to a number of rows or columns of the pixel units in the portion of the plurality of rows or columns, the number of rows or columns of the pixel units which are shielded, and the number of rows or columns of the pixel units that are not lighted up in the acquired image.

For example, the display method provide by at least one embodiment of the present disclosure further comprises: determining a target size of the display panel; and determining the number of rows or columns of the pixel units in the portion of the plurality of rows or columns which are lighted up according to the target size.

For example, in the display method provide by at least one embodiment of the present disclosure, the plurality of pixel units are divided into M rows and N columns; and the determining the display region of the display substrate includes: in a row direction or a column direction, starting from a first row of pixel units or a first column of pixel units at a first side of the pixel region, sequentially lighting up the pixel units in the pixel region row by row or column by column, and detecting an acquired image of the display panel while lighting up the pixel units in the pixel region; until a bright line appears in the acquired image, determining the pixel units in a row of a column where the bright line is located as a boundary of the pixel region on the first side, and acquiring a row number or a column number of the pixel units disposed at the boundary on the first side; in the row direction or the column direction, starting from a Mth row or a Nth column at a second side of the pixel region, sequentially lighting up the pixel units in the pixel region row by row or column by column, and detecting an acquired image of the display panel while lighting up the pixel units in the pixel region; and until a bright line appears in the acquired image, determining the pixel units in a row or a column where the bright line is located as a boundary of the pixel region on the second side, and acquiring a row number or a column number of the pixel units disposed at the boundary on the second side, in which the first side and the second side are two opposite edges of the pixel region.

For example, the display method provide by at least one embodiment of the present disclosure further comprises feeding back information of the pixel units disposed at the boundary to a driving unit of the display panel.

For example, the display method provide by at least one embodiment of the present disclosure further comprises acquiring information of the display region of the display panel by a driver chip of the display panel; and driving the display panel to provide image signals for the pixel units in the display region, so as to display an image.

At least one embodiment of the present disclosure provides a display device, comprising the display panel as mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE NUMERALS OF THE ACCOMPANYING DRAWINGS

101—display substrate; 1011—display region; 102—package substrate; 1021—frame; 1022—light transmission region; 103—glue; 201—display substrate; 202—package substrate; 2021—frame; 2022—light transmission region; 203—glue; 1—display device; 10—display panel.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "let," "right," or the like are only used to indicate relative position relationship, and when the position of the object which is described is changed, the relative position relationship may be changed accordingly.

Figure 1A:
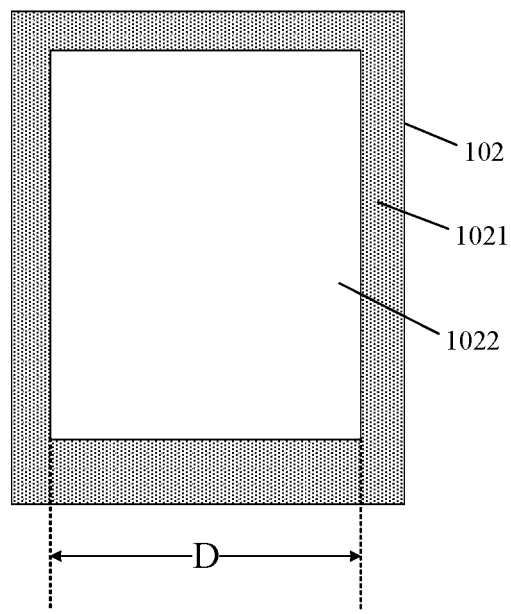
FIG. 1A is a schematic diagram of a package substrate.
Figure 1B:
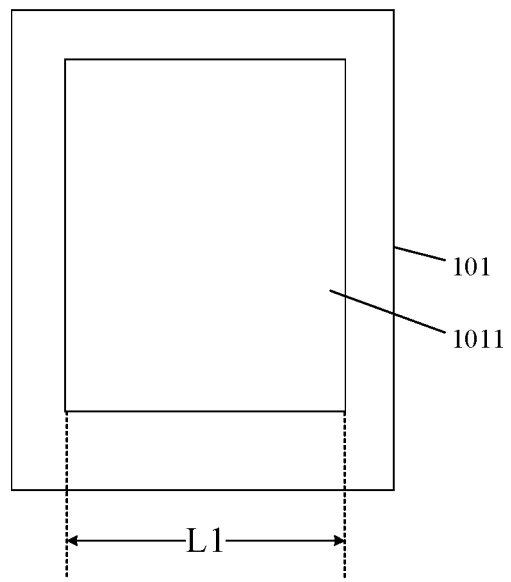
FIG. 1B is a schematic diagram of a display substrate.

As described above, the manufacturing process of the display panel generally comprises: cell-assembling a display substrate provided with a plurality of pixel units and a package substrate, and then packaging functional structures such as the pixel units and a driving circuit on the display substrate. For example, FIG. 1A shows a package substrate, and FIG. 1B shows a display substrate. As shown in FIGS. 1A-1B, the display substrate 101 comprises a display region 1011. A size of the display region 1011 typically has a target value, e.g., 20 inches or 50 inches. The display region 1011 includes a plurality of pixel units (not shown in the figure). These pixel units are used for displaying an image. The package substrate 102 includes a frame 1021 and a light transmission region 1022, corresponding to the display region 1011 of the display substrate 101 and disposed inside the frame 1021. Thus, after the display substrate 101 and the package substrate 201 are cell-assembled to form a display panel, an image displayed on the display region 1011 of the display substrate 101 can be seen from outside of the display panel.

Figure 1C:
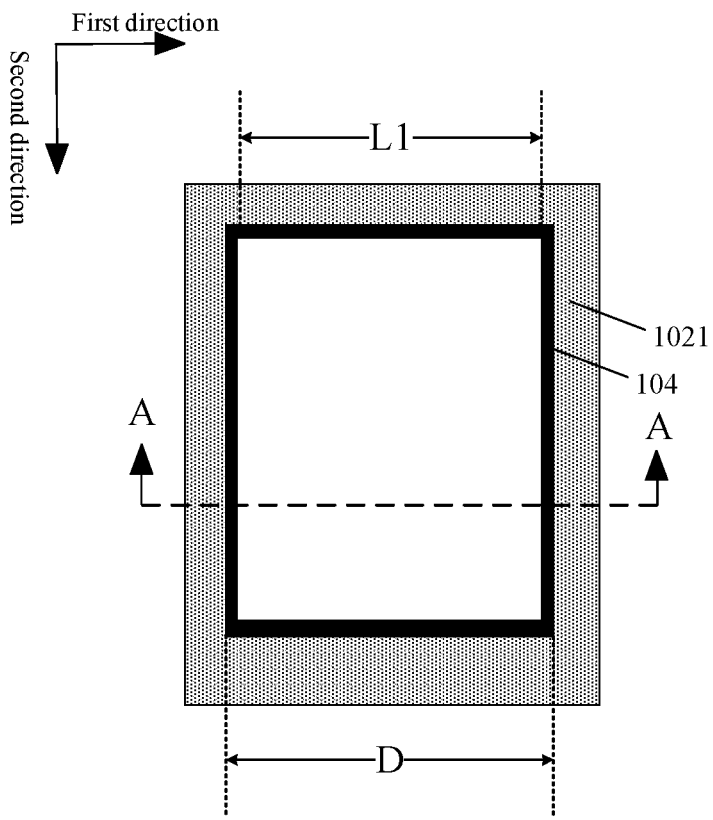
FIG. 1C is a schematic diagram of a display panel.
Figure 1D:
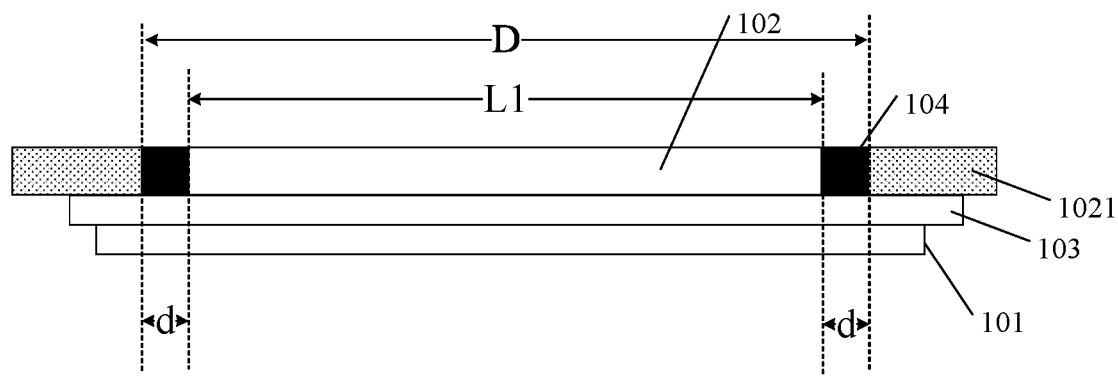
FIG. 1D is a cross-sectional view of the display substrate in FIG. 1C along the A-A line.

FIG. 1C is a schematic diagram of a display panel formed by cell-assembling of the package substrate as shown in FIG. 1A and the display substrate as shown in FIG. 1B. As shown in FIG. 1C, taking a first direction as an example, in a case where a target value of the display region 1011 is determined and a length of the display region 1011 is determined to be L1, a distance D between the frames 1021 on both sides of the package substrate 102 in the first direction is generally greater than the length L1 of the display region 1011, so as to ensure that the frames of the package substrate cannot cover the display region 1011 of the display substrate 101 when an alignment error is generated during cell-assembling of the package substrate 102 and the display substrate 101. FIG. 1D is a cross-sectional view of the display panel in FIG. 1C along the AA line. For example, D is about 200 μm-1200 μm larger than L1, that is, in FIG. 1D, a distance d of about 100 μm-600 μm is reserved on the frames 1021 on both sides of the package substrate 102. Thus, after the package substrate 102 and the display substrate 101 are cell-assembled, for example, after the package substrate 102 is cell-assembled with the display substrate 101 via glue 103, the display region of the display substrate 101 can completely fall into the light transmission region 1022 inside the frame 1021 without being blocked by the frame 1021. At this point, the display region 1011 of the display substrate 101 has the same length with a pixel region (a region provided with the pixel units), that is, all the pixel units on the display substrate 101 are used for display. Since there is no bright pixel unit at the distance d reserved for the frames 1021 on both sides of the package substrate 102, when the display panel formed by cell-assembling of the package substrate 102 and the display substrate 101 displays an image, a position of the display panel corresponding to the distance d is black, that is, a black edge 104 is generated. The black edge 104 is equivalent to increasing the width of the frame, which is not conducive to the narrow frame design of the display panel and affects the display effect of the display panel.

At least one embodiment of the present disclosure provides a display panel, which comprises: a display substrate and a package substrate, wherein the display substrate includes a pixel region; the package substrate includes frames and a light transmission region surrounded by the frames; a plurality of pixel units are disposed in the pixel region of the display substrate; a length L of the pixel region of the display substrate is greater than a distance D between the frames of the package substrate at least in a first direction; and an orthographic projection of the pixel region on the display substrate at least partially covers an orthographic projection of the light transmission region on the display substrate.

At least one embodiment of the present disclosure provides a display method of a display panel. The display panel is the foregoing display panel. The display method comprises: determining the display region of the display substrate.

At least one embodiment of the present disclosure provides a display device, which comprises the display panel as mentioned above.

Description will be given below to the display panel, the display device and the display method, provided by the present disclosure, with reference to several embodiments.

At least one embodiment of the present disclosure provides a display panel, which comprises: a display substrate and a package substrate, wherein the display substrate includes a pixel region; the package substrate includes frames and a light transmission region surrounded by the frames; a plurality of pixel units are disposed in the pixel region of the display panel; a length L of the pixel region of the display substrate is greater than a distance D between the frames of the package substrate at least in a first direction; and an orthographic projection of the pixel region on the display substrate at least partially covers an orthographic projection of the light transmission region on the display substrate. In the embodiment, for instance, the display substrate and the package substrate may be cell-assembled via glue 203, e.g., optical adhesive. No limitation will be given here in the embodiment.

In the embodiment, the description that the orthographic projection of the pixel region on the display substrate at least partially covers the orthographic projection of the light transmission region on the display substrate may be that the orthographic projection of the pixel region on the display substrate completely covers the orthographic projection of the light transmission region on the display substrate, and may also be that the orthographic projection of the pixel region on the display substrate covers the orthographic projection of the light transmission region on the display substrate in at least one direction. No limitation will be given here in the embodiment.

In the embodiment, the display substrate, for instance, may be formed by cell-assembling of an array substrate and an opposed substrate. The display substrate, for instance, may be various types of display substrates such as a liquid crystal display (LCD) substrate or an organic light-emitting diode (OLED) display substrate. No limitation will be given here in the embodiment.

Figure 2:
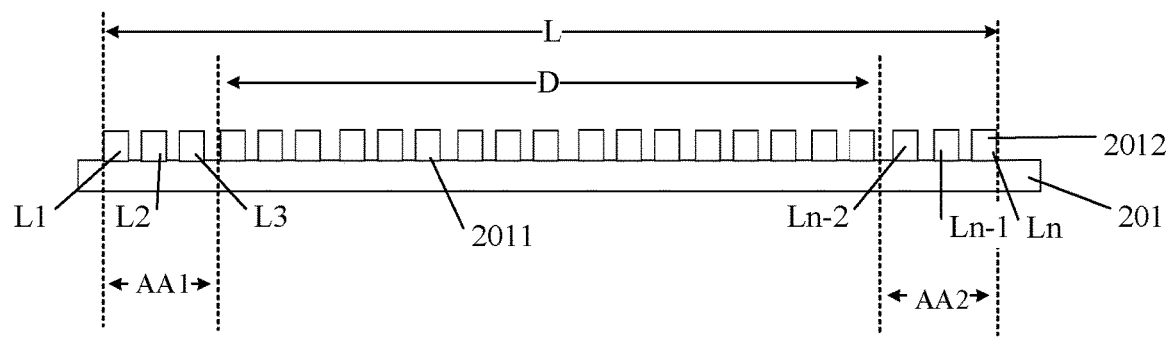
FIG. 2 is a schematic cross-sectional view of a display substrate provided by an embodiment of the present disclosure.

For instance, when the display panel is rectangular, a short-side direction and a long-side direction of the display panel are set to be the first direction and the second direction respectively. For instance, FIG. 2 is a schematic cross-sectional view of the display substrate in one example of the embodiment along the short-side direction, namely the first direction. The schematic cross-sectional view of the display substrate along the long-side direction is similar to this, so no further description will be given here.

As shown in FIG. 2, the display substrate 201 includes a pixel region; a plurality of pixel units are disposed in the pixel region; a length L of the pixel region is greater than a distance D in the same direction between frames on both sides of a package substrate to be cell-assembled with the display substrate; for instance, a left side of the pixel region in FIG. 2 may exceed an inner edge of the left frame of the package substrate to be cell-assembled with the display substrate by pitches (a pitch of one pixel unit means that a length of a pixel unit in a direction adds a spacing distance of adjacent pixel units in the direction) of about three pixel units, namely an AA1 region in the figure is a region by which the left side of the pixel region exceeds the inner edge of the left frame of the package substrate to be cell-assembled with the display substrate; and a right side of the pixel region may exceed an inner edge of a right frame of the package substrate to be cell-assembled with the display substrate by a distance of about three pixel unit pitches, namely an AA2 region in the figure is a region by which the right side of the pixel region exceeds the inner edge of the right frame of the package substrate to be cell-assembled with the display substrate. Thus, after the package substrate 202 and the display substrate 201 are cell-assembled to form the display panel, pixel units exposed by the light transmission region 2022 surrounded by the frames 2021 of the package substrate 202, namely pixel units within a range of a length D, in the pixel region of the display substrate 201 can be seen from outside of the display panel. This portion of the pixel units are used for displaying an image, namely the portion of the pixel units form the display region of the display substrate 201. At this point, an area of the pixel region in the display substrate 201 is greater than an area of the display region.

For instance, the inner edge of the frame is an edge closer to a center of the display substrate.

For instance, in various directions, a length of the pixel region of the display substrate is greater than a distance between the frames on both sides of the package substrate. For instance, in the above example, the length L of the pixel region of the display substrate in the first direction is greater than the distance D in the same direction between the frames on both sides of the package substrate and the length L of the pixel region of the display substrate in the second direction is greater than the distance D in the same direction between the frames on both sides of the package substrate, so the light transmission region inside the frame of the package substrate may be filled with the pixel units completely. Thus, after the package substrate and the display substrate are cell-assembled to form the display panel, there is not a region where a pixel unit is arranged and which is reserved in the package substrate for preventing the influence of the alignment deviation of the display substrate and the package substrate on displaying (for instance, a region in FIG. 1D with a width of d), so the display panel provided by the embodiment of the present disclosure basically does not have black edge during displaying.

It should be noted here that during displaying of the display panel provided by the embodiment of the present disclosure, when the inner edge of the frame only just falls within a spacing region between two adjacent pixel units, it may exist that an image is not displayed in a region whose size is equal to or less than a spacing distance m between two adjacent pixel units; or during manufacturing, the distance between the inner edges of the frames of the package substrate may be reserved to be a width of one pixel unit pitch or two pixel unit pitches greater than the display region, but it's not noticeable for the human eyes, just as an interval between the adjacent pixel units is not noticeable when the display panel displays an image. Thus, when the display panel provided by the embodiment of the present disclosure displays an image, a region surrounded by the frames is all used for displaying, and there is no any black edge.

Illustratively, the pixel region includes a display region and a non-display region surrounding the display region; in the first direction, a length of the display region in the direction is set to be L1; and a distance D between the frames on both sides of the package substrate and the length L1 may be set to satisfy the following relational expression:

$$L1 + P1 \geq D \geq L1;$$

in which P1 refers to a pitch of one pixel unit in the direction, namely a distance of one pixel unit plus a spacing distance between two adjacent pixel units.

Figure 7:
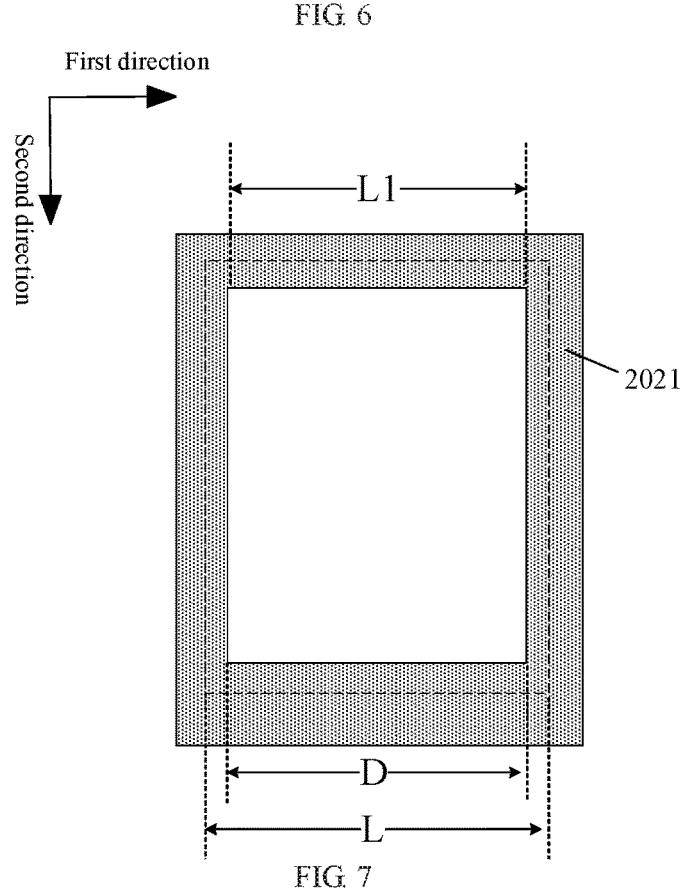
FIG. 7 is a schematic diagram of a display panel provided by an embodiment of the present disclosure.

For instance, as shown in FIG. 7, a length L of the pixel region of the display panel is greater than a distance D between the frames of the package substrate in the first direction and a length L of the pixel region of the display panel is greater than the distance D between the frames of the package substrate in the second direction, so pixel units used for display completely fill inside the frame of the display panel, namely the distance D between the frames of the package substrate is basically equal to the length L1 of the display region (D and L1 in the first direction are shown in the figure, and the second direction is similar to this). Thus, there is no black edge on four boundaries of the display panel, so narrow frame of the display panel can be realized, and then the user experience can be improved.

For instance, the display panel may be various types of display panels such as an LCD panel or an OLED display panel. No limitation will be given here in the embodiment.

At least one embodiment of the present disclosure provides a display method of a display panel. The display panel is the foregoing display panel. The display method comprises: determining a display region of the display substrate, for instance, determining an actual size and/or position of the display region after cell-assembling of the display substrate and the package substrate.

For instance, in the embodiment, as the length L of the pixel region is greater than the distance D in the same direction between the frames on both sides of the package substrate to be cell-assembled with the display substrate, after cell-assembling of the package substrate 201 and the display substrate 101, a portion of pixel units will be shielded by the frames 2021. Thus, the portion of pixel units are not used for displaying, while a portion of pixel units of the display substrate 101 disposed in the light transmission region inside the frame 2021 of the package substrate 202 are used for displaying. Therefore, in the embodiment, the pixel units used for displaying may be determined by determining the display region of the display substrate.

For instance, the display region of the display substrate may be determined by a lighting up test. For instance, the lighting up test may include: detecting whether the pixel units in the pixel region are shielded when the pixel units in the pixel region are lighted up, and determining the pixel units disposed in the display region of the display substrate.

For instance, the lighting up test may be adopted to determine information, for instance, row coordinate information, column coordinate information or polar coordinate information, of the pixel units disposed at a boundary of the display region of the display substrate, and then determine the pixel units disposed in the display region of the display substrate.

For instance, detailed description will be given in the example by taking the case that the display panel is a rectangular display panel and the pixel units disposed at the boundary of the display region in a short-side direction, namely a first direction of the display panel, are to be determined as an example.

For instance, in one example of the embodiment, in the first direction, the plurality of pixel units are divided into a plurality of columns. In the example, when there may be certain difference between the distance D between the frames on both sides of the package substrate 202 and the distance L1 of the display region, for instance, when D is slightly greater than L1, a step of lighting up the pixel units in the pixel region, for instance, may include: lighting up pixel units in a portion of the columns disposed at an edge of one side of the pixel region, detecting an acquired image of the display panel, determining the number of columns of shielded pixel units, and determining the number of columns of pixel units that are not lighted up in the image; and determining a row number or a column number of the pixel units disposed at the boundary according to the number of columns of the lighted up pixel units in the portion of the columns, the number of columns of the shielded pixel units, and the number of columns of the pixel units that are not lighted up in the image.

Figure 3:
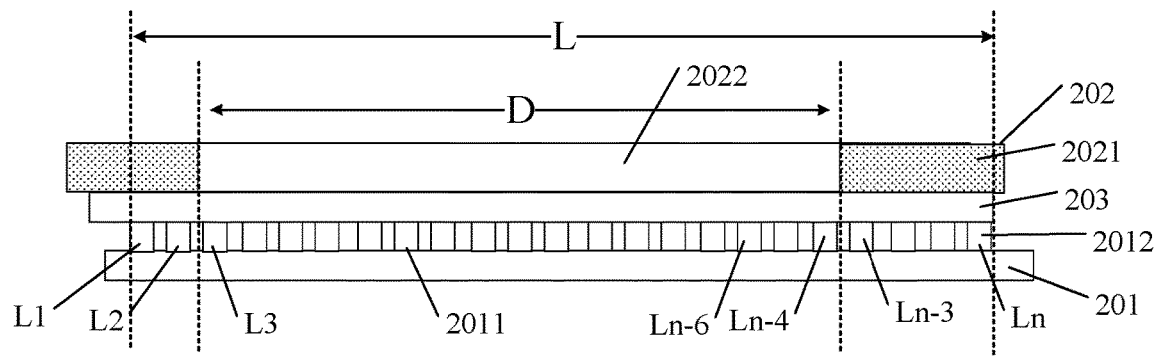
FIG. 3 is a schematic cross-sectional view of a product obtained after cell-assembling of the display substrate provided by an embodiment of the present disclosure and a package substrate.

For instance, with reference to FIG. 3, in the lighting up test, pixel units in L1-L6 columns in the display substrate 201 are set to be lighted up, and an acquired image of the display panel is detected. As only four columns of the lighted up pixel units may be displayed in the image, it is determined that the pixel units in the L1 and L2 columns are shielded, and then the pixel units disposed at a boundary of a left side are determined to be the L3 column of pixel units. As n-10 columns of pixel units are not lighted up as shown in the image, it can be concluded that the light transmission region of the package substrate 202 may expose n-6 columns of pixel units, namely the number of columns of the pixel units in the actual display region may be determined. In the example, the number of the columns of the actual display region is equal to the number of the columns of the target display region. In other examples, the number of columns of the actual display region may be greater than, for instance, one or two greater than, the number of the columns of the target display region. No limitation will be given here in the embodiment. In the example, according to parameters obtained from the above, the pixel units at a right boundary may also be determined to be the (Ln-4)th column of pixel units, and then the column numbers of the pixel units disposed at the boundaries of the display region of the display substrate in the first direction are determined to be L3 and Ln-4, namely the pixel units disposed in the display region of the display panel are pixel units from L3th column pixel unit to (Ln-4)th column pixel unit.

Illustratively, in the embodiment of the present disclosure, during determining the display region of the display panel, a target size of a display region of a display panel to be manufactured need to be determined. For instance, a size of the display region may be a specific target value, e.g., 14 inches, 20 inches or 50 inches. Correspondingly, when a shape of the display region is determined, lengths of the display region in various directions may be determined. For instance, when a shape of the display region is rectangular shape, the length and the width of the display region may be determined according to the target size. Correspondingly, the distance between the inner edges of the frames of the package substrate cell-assembled with the display substrate may be determined according to the target size, for instance, in the same direction, may be one pixel unit pitch or two pixel unit pitches greater than a target length of the display region.

In the embodiment of the present disclosure, as the length L of the pixel region of the display substrate is greater than the distance D between the frames of the package substrate, after cell-assembling, a position of the display region need to be determined, for instance, the pixel units at a boundary need to be determined, so that only the pixel units in the display region are turned-on during displaying. Moreover, in the embodiment of the present disclosure, an actual size of the display region may also be determined, and the determined actual size of the display region, for instance, may be slightly deviated from the target size, for instance, with a deviation of a distance of one pixel unit pitch, two pixel unit pitches, one spacing distance of adjacent pixel units, or the actual size may be equal to the target size. No limitation will be given here in the embodiment of the present disclosure. Or the position and the actual size of the display region are simultaneously determined.

For instance, in the example, the plurality of pixel units are divided into a plurality of columns arranged in the first direction, and an extension direction of each column is perpendicular to the first direction.

At this point, a step of lighting up the pixel units in the pixel region includes: lighting up the pixel units in a portion of the columns.

For instance, the display method provided by the embodiment may comprise: determining the target size of the display panel, and determining the number of rows or columns of the lighted up pixel units in the portion of rows or columns according to the target size.

For instance, during lighting up the pixel units in the portion of the columns, the number of columns of the lighted up pixel units need to be determined.

In one example, when the target size of the display region of the display panel is determined, the target number of columns of the pixel units in the display region may be determined. For instance, the number of columns of the pixel units which is lighted up is the same with the target number of columns of the pixel units in the display region. For instance, in the example as shown in FIG. 3, the target number of columns of the pixel units in the display region is set to be n-6 columns. At this point, for instance, both the left side and the right side of the pixel region may be set to exceed the corresponding inner edges of the frames of the package substrate to be assembled with the display substrate by two pixel unit pitches and three pixel unit pitches (three pixel unit pitches shown in the figure). In this case, the distance D between the frames on both sides of the package substrate 202, namely the length of the light transmission region, may be set to be able to expose n-6 columns of pixel units. For instance, D=L1. Thus, for instance, n-6 columns of pixel units may be lighted up, for instance, the pixel units from the L2th column to the (Ln-5)th column in the display substrate 201 are lighted up, and then whether these pixel units are shielded by the frames 2021 of the package substrate 202 when being lighted up is detected. Therefore, the display region of the display substrate, namely the region exposed by the light transmission region of the package substrate 202, is determined.

For instance, in FIG. 3, after the pixel units from L2th column to (Ln-5)th column are lighted up, the acquired image of the display panel is detected, and the number of columns of the pixel units which are shielded is determined. Subsequently, the column number of the pixel units disposed at a boundary is determined according to the number of columns of the pixel units which are lighted up and the number of columns of the shielded pixel units. For instance, in the example, it is found through the image of the display panel that one column of pixel units disposed on the right side are not lighted up. As the number of columns of the pixel units which are lighted up is the same with the number of columns of the pixel units exposed by the light transmission region of the package substrate 202, it may be concluded that one column of pixel units are shielded. As the pixel units on the rightmost side which are lighted up are the (Ln-5)th column of pixel units, it may be determined that the (Ln-4)th column of pixel units exposed by the light transmission region of the package substrate 202 are not lighted up, that is, the (Ln-4)th column of pixel units may be determined to be disposed at a right boundary of the display region of the display substrate 101. In addition, as the pixel units from L2th column to (Ln-5)th column are set to be lighted up in this lighting up test, n-6 columns of pixel units may be exposed by the light transmission region of the package substrate 202, so it may be determined that the L2th column of pixel units disposed on the left side of the image of the display panel are shielded, namely a first column of pixel units disposed on the left side of the image of the display panel is the L3th column of pixel units. Thus, it is determined that the column numbers of the pixel units disposed at the boundaries of the display region of the display panel in the first direction are the L3th column and the (Ln-4)th column, namely the pixel units disposed in the display region of the display panel are pixel units from the L3th column to the (Ln-4)th column.

For instance, in another example of the embodiment, the column number of the pixel units disposed at the boundary may also be obtained by lighting up the pixel units column by column.

Figure 4:
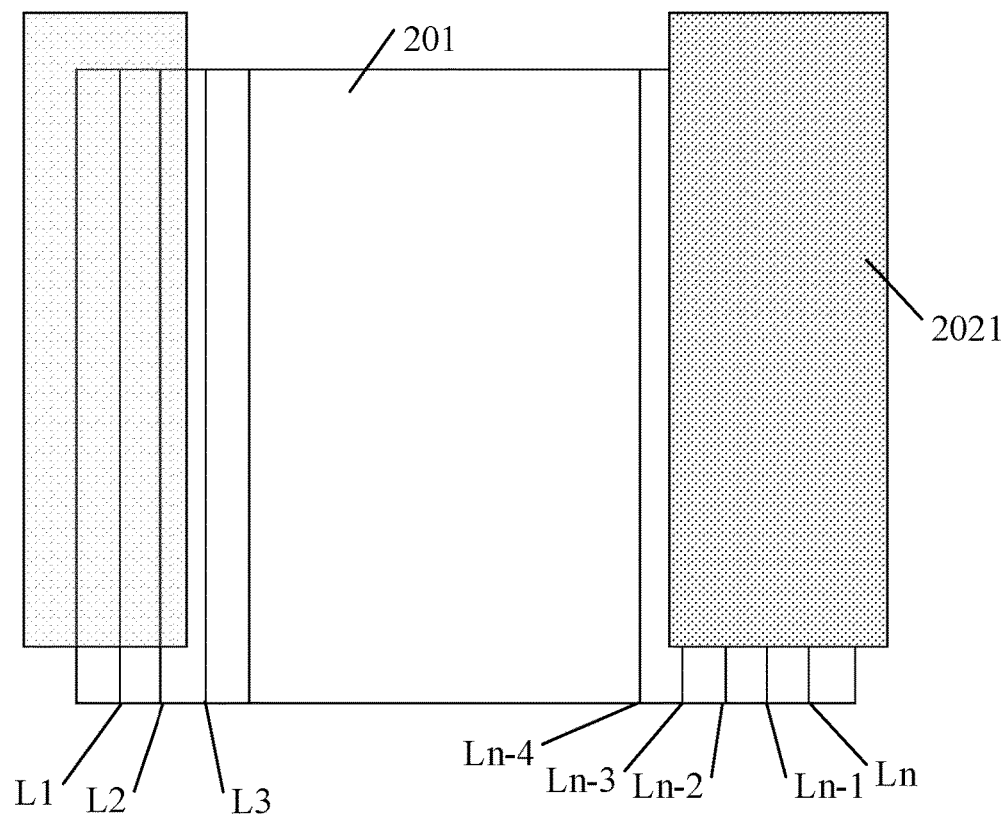
FIG. 4 is a schematic diagram illustrating the lighting up test in an embodiment of the present disclosure.

For instance, description is given here by still taking the first direction as an example with reference to FIGS. 3 and 4. The plurality of pixel units are divided into N columns. In the first direction, starting from a first column of pixel units on a first side of the pixel region of the display substrate 201, for instance, a left side of the pixel region in FIGS. 3 and 4, the pixel units in the pixel region are sequentially lighted up column by column; when the pixel units are lighted up, the acquired image of the display panel is detected until a bright line appears in the image, the pixel units in the column where the bright line is located may be determined to be a boundary of the pixel region at the side, and meanwhile, the column number of the pixel units at the boundary of the side of the pixel region is obtained. For instance, FIG. 4 illustrates the structure of a portion of the display substrate 201 and a portion of the frame 2021. As shown in FIG. 4, during lighting up the L1th column of pixel units, as the L1th column of pixel units are shielded by the frame 2021, light from the column of pixel units cannot be seen from outside of the display panel, and likewise, light from the L2th column of pixel units cannot be seen as well. Until the L3th column of pixel units are lighted up, a bright line generated by the column of pixel units can be seen from outside of the display panel, and then the column number of the pixel units disposed at a left boundary may be determined to be L3.

Similarly, starting from the Nth column of pixel units at a second side of the pixel region, for instance, at the right side of the pixel region in FIGS. 3 and 4, the pixel units in the pixel region are sequentially lighted up column by column; when the pixel units are lighted up, the acquired image of the display panel is detected until a bright line appears in the image, the pixel units in the column where the bright line is located may be determined to be a boundary of the pixel region at the side, and meanwhile, the column number of the pixel units at the boundary of the side of the pixel region is obtained. For instance, in FIG. 4, when the pixel units in the Lnth column, the (Ln-1)th column and the like are sequentially lighted up until the (Ln-4)th column of pixel units are lighted up, a bright line is observed from outside of the display panel, and then the column number of the pixel units disposed at a right boundary is determined to be Ln-4. Thus, the column numbers of the pixel units disposed at the boundaries of the display region of the display substrate in the first direction are determined to be L3 and Ln-4, namely the pixel units disposed in the display region of the display panel are pixel units from the L3th column to the (Ln-4)th column.

In the example, for instance, when the target size of the display region of the display panel is determined, namely when the target number of columns of the pixel units in the display region is determined, and for instance, the distance D between the frames on both sides of the package substrate is equal to or slightly greater than the target length L1 of the display region in the first direction, only the column number of the pixel units at a boundary on one side, such as, the first side or the second side of the display panel, may be detected, and subsequently, the column number of the pixel units at a boundary on the other side of the display panel is deduced according to the target number of the columns of the pixel units in the display region. For instance, when the target number of the columns of the pixel units in the display region is n-6, it is obtained from the column-by-column lighting up test that the column number of the pixel units disposed at a left boundary is L3, and it may be concluded through calculation that the column number of the pixel units disposed at a right boundary is Ln-4, and then it may be concluded that the pixel units disposed in the display region of the display panel are pixel units in the columns from the L3th column to the (Ln-4)th column. Or when the target number of the columns of the pixel units in the display region is set to be n-6, it is obtained from the column-by-column lighting up test that the column number of the pixel units disposed at a right boundary is Ln-4, and it can be concluded through calculation that the column number of the pixel units disposed at a left boundary is L3, and then it can be concluded that the pixel units disposed in the display region of the display panel are pixel units in the columns from the L3th column to the (Ln-4)th column.

In the embodiment, as the package substrate may shield half of one pixel unit after cell-assembling of the package substrate and the display substrate, and the distance D between the frames on both sides of the package substrate may be reserved to exceed a set target length L1 of the display region by a distance of, for example, a length of one pixel unit (at this point, $L1+P1>D>L1$) or a pitch of one pixel unit (at this point, $D=L1+P1$), so as to avoid reducing the number of the pixel units disposed in the display region of the display panel, so that the influence on the display effect of the display panel may be avoided after cell-assembling of the package substrate and the display substrate.

Figure 5:
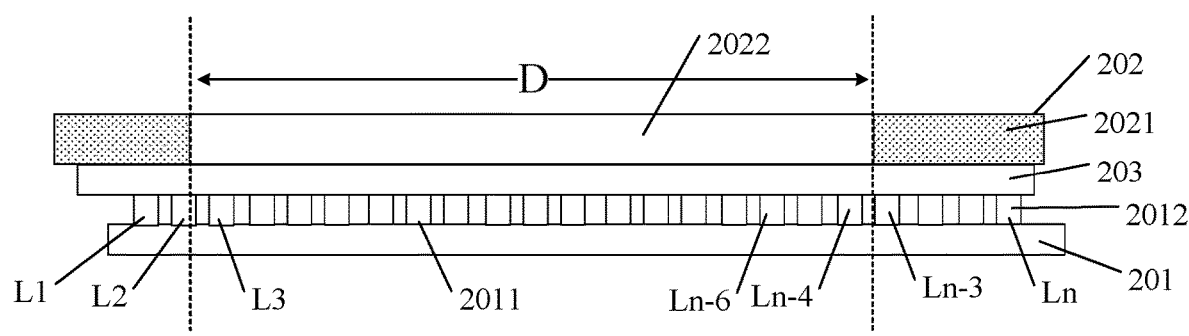
FIG. 5 is a schematic cross-sectional view of a product obtained after cell-assembling of the display substrate provided by an embodiment of the present disclosure and a package substrate.
Figure 6:
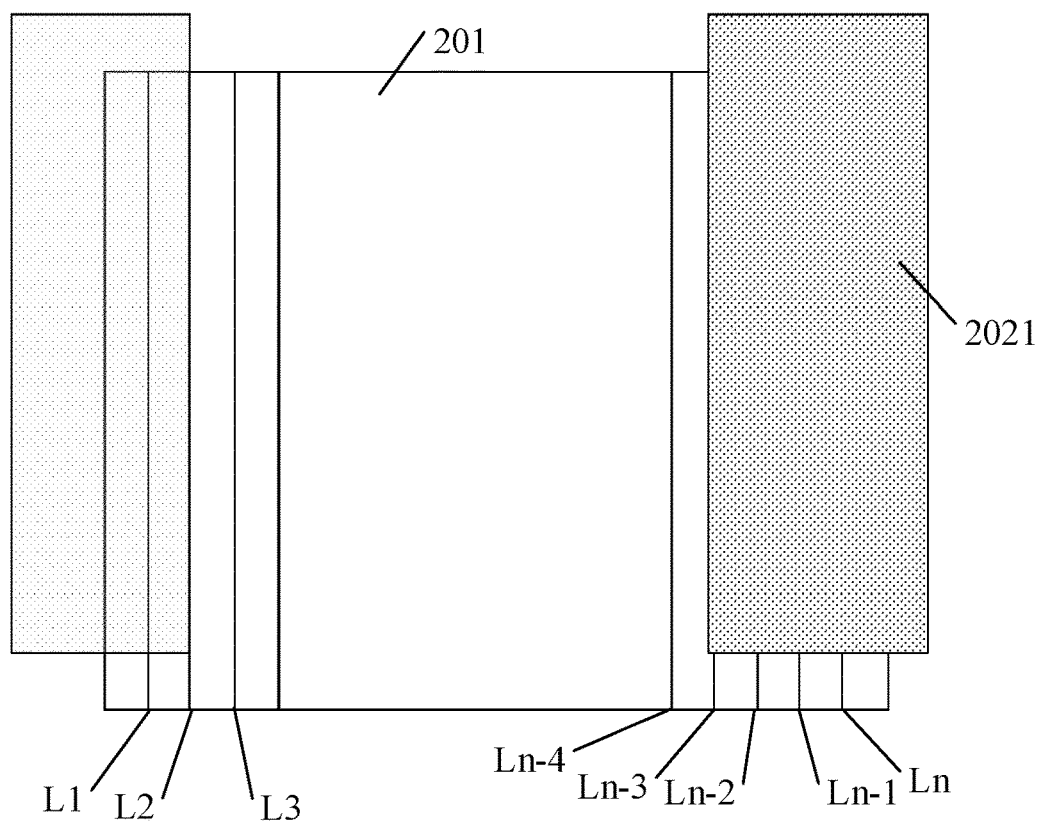
FIG. 6 is a schematic diagram illustrating the lighting up test in another embodiment of the present disclosure.

For instance, FIGS. 5 and 6 illustrate a case that the distance of one pixel unit is reserved for the distance D between the frames on both sides of the package substrate compared with the length L1 of the display region. As shown in FIGS. 5 and 6, in the example, for instance, in the first direction, the target number of columns of the pixel units in the display region is set to be n-6, so the distance between the frames on both sides of the package substrate, namely the length of the light transmission region, may be set to expose n-5 columns of pixel units at most, namely the distance of one pixel unit more is reserved for the distance between the frames on both sides of the package substrate. Thus, when the frames of the package substrate as shown in FIGS. 5 and 6 shield half of one pixel unit in the L2th column, it may be considered that the column of pixel units are shielded. The column number of the pixel units disposed at a left boundary is set to be L3. As the distance of one pixel unit more is reserved for the frames on both sides of the package substrate in the example, the frame on the right side of the package substrate can only shield the (Ln-3)th column of pixel units and will not shield the (Ln-4)th column of pixel units. Thus, the column numbers of the pixel units disposed at the boundaries of the display region of the display substrate in the first direction are determined to be L3 and Ln-4, namely the pixel units disposed in the display region of the display panel are pixel units in the columns from L3 to Ln-4.

For instance, the display method provided by the embodiment may further comprise: feeding back information of the pixel units disposed at the boundaries to a driving unit of the display panel obtained after cell-assembling of the display substrate and the package substrate.

For instance, the display method provided by the embodiment may further comprise: acquiring information of the display region of the display panel by a driver chip of the display panel, and driving the display panel to provide image signals for the pixel units in the display region, so as to display an image. Therefore, the display panel can be controlled to only light up the pixel units disposed in the display region during displaying and not light up the pixel units shielded by the package substrate, so as to reduce the energy consumption.

For instance, when the display panel obtains the information of the pixel units in the display region of the display panel through the lighting up test, for instance, obtains the column numbers of the pixel units disposed in the display region by adoption of the method provided by the embodiment, and obtains the row numbers of the pixel units disposed in the display region by the same method, the display panel may be only driven to provide image signal for the pixel units in the rows and the columns disposed in the display region and not provide the image signal for the pixel units in the non-display region, so as to selectively output the signals. The display method can achieve the technical effect of reducing energy consumption.

It should be noted that detailed description has been given in the above embodiments by taking the first direction of the rectangular display panel as an example, and obviously, a boundary of the pixel units in the second direction of the display panel may also be determined by using the above method, so no further description will be given in the embodiment.

In the embodiment, the display panel may be a regular shape such as a rectangle, and of course, may also be other shapes, for instance, an irregular shape or a shape with radian. At this point, the information of the pixel units disposed at a boundary of the display region of the display substrate, for instance, may be row coordinate information, column coordinate information, polar coordinate information, etc. No limitation will be given here in the embodiment. The information of the pixel units disposed at a boundary in the display panel may also be determined by the above method. For instance, when the display panel is a regular hexagon, the hexagon has three pairs of mutually parallel sides, so a first direction, a second direction and a third direction may be respectively set on the basis of the three pairs of mutually parallel sides, and boundaries of the display region in the three directions may be respectively determined, for instance, the coordinate information of the pixel units disposed at the boundaries of the display region is determined. Moreover, for instance, when the display panel is circular, any direction of the circular display panel may be set to be the first direction, and subsequently, a boundary of the pixel units running through a center of the circular display region in the direction is determined, for instance, a polar coordinate information of the pixel units disposed at a boundary of the display region in the direction is determined. Thus, an actual radius length of the display region of the display panel may be determined, and then a display boundary of the display region in other directions may be determined.

Pixel units for displaying completely fill inside the frame of the display panel provided by the embodiment. When the display substrate and the package substrate are cell-assembled to form the display panel, an alignment distance is not required to be reserved in the light transmission region of the package substrate, so there is no black edge in the formed display panel. Thus, the narrow frame design of the display panel can be realized, and then the user experience can be improved.

For instance, there is black edge with a length of about d=100 μm-600 μm on both sides of the display panel in FIG. 1D, but there is no black edge in the display panel provided by the embodiment, or when a distance of one pixel unit or a pitch of one pixel unit more is reserved for the frame of the package substrate, the distance between the frame and the display region at any side is only about 15 μm-40 μm. It can clearly be seen that the display panel manufactured by the method provided by the embodiment basically has no black edge.

For instance, as shown in FIG. 7, pixel units for displaying completely fill inside the frame of the display panel provided by the embodiment, namely the distance between the frames of the package substrate is basically equal to the length L1 of the display region (D and L1 in the first direction are shown in the figure, and the second direction is similar to this). Thus, there is no black edge at four boundaries of the display panel, so the narrow frame of the display panel can be realized and the user experience can be improved.

Figure 8:
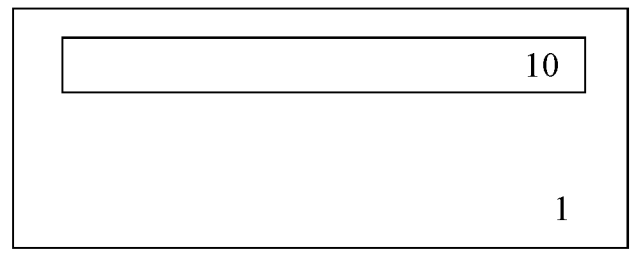
FIG. 8 is a schematic diagram of a display device provided by an embodiment of the present disclosure.

At least one embodiment of the present disclosure further provides a display device. As shown in FIG. 8, the display device 1 comprises the foregoing display panel 10. The display device 1, for instance, may be any product or component with display function such as an LCD panel, e-paper, an OLED display panel, a mobile phone, a tablet PC, a TV, a display, a notebook computer, a digital frame or a navigator. No limitation will be given here in the embodiment.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged, that is, the accompanying drawings are not drawn according to the actual scale. However, it should understood that, in the case in which a component or element such as a layer, film, region, substrate or the like is referred to be "on" or "under" another component or element, it may be directly on or under the another component or element or a component or element is interposed therebetween.

(3) In case of no conflict, features in one embodiment or in different embodiments can be combined.

What are described above is related to the specific embodiments of the disclosure only and not limitative to the scope of the disclosure. Any modification and equivalent replacement may be made by those skilled in the art within the substantial protection scope of the embodiments of the present disclosure, which is regarded as falling within the protection scope of embodiments of the present disclosure. The protection scope of the disclosure shall be based on the protection scope of the claims.

The invention claimed is:

1. A display panel, comprising:
   a display substrate and a package substrate, the display substrate including a pixel region, the package substrate including frames and a light transmission region surrounded by the frames,
   wherein a plurality of pixel units are disposed in the pixel region of the display substrate; a length L of the pixel region of the display substrate is greater than a distance D between the frames of the package substrate at least in a first direction; and
   an orthographic projection of the pixel region on the display substrate at least partially covers an orthographic projection of the light transmission region on the display substrate,
   wherein the pixel region includes a display region and a non-display region disposed at a periphery of the display region; and
   at least in the first direction, a length of the display region of the display substrate is L1, and the distance D between the frames on both sides of the package substrate and the length L1 satisfy a following relationship:

$$L1+P1 \geq D \geq L1;$$

in which P1 is a pitch of one pixel unit in the direction.

2. The display panel according to claim 1, wherein in each direction, a length of the pixel region of the display substrate is greater than a distance between the frames disposed on both sides of the package substrate.

3. A display method of the display panel according to claim 1, comprising:
   determining the display region of the display substrate.

4. The display method according to claim 3, wherein the determining the display region of the display substrate includes:

lighting up the pixel units in the pixel region; and
determining the display region of the display substrate by detecting whether the pixel units in the pixel region are shielded by the frame when the pixel units are lighted up.

5. The display method according to claim 4, wherein the determining the display region of the display substrate includes:
determining information of the pixel units disposed at a boundary of the display region of the display substrate.

6. The display method according to claim 5, wherein the information of the pixel unit includes row and/or column coordinate information or polar coordinate information.

7. The display method according to claim 6, further comprising:
feeding back information of the pixel units disposed at the boundary to a driving unit of the display panel.

8. The display method according to claim 5, wherein the plurality of pixel units are divided into a plurality of rows and a plurality of columns, the lighting up the pixel units in the pixel region includes:
lighting up the pixel units in a portion of the plurality of rows or columns disposed at an edge on a side of the pixel region; and
the determining the display region of the display substrate by detecting whether the pixel units in the pixel region are shielded when the pixel units are lighted up includes:
detecting an acquired image of the display panel, determining a number of rows or columns of the pixel units which are shielded, and determining a number of rows or columns of the pixel units that are not lighted up in the acquired image; and
determining a row number or a column number of the pixel units disposed at the boundary according to a number of rows or columns of the pixel units in the portion of the plurality of rows or columns, the number of rows or columns of the pixel units which are shielded, and the number of rows or columns of the pixel units that are not lighted up in the acquired image.

9. The display method according to claim 8, further comprising:
determining a target size of the display panel; and
determining the number of rows or columns of the pixel units in the portion of the plurality of rows or columns which are lighted up according to the target size.

10. The display method according to claim 9, further comprising:
feeding back information of the pixel units disposed at the boundary to a driving unit of the display panel.

11. The display method according to claim 8, further comprising:
feeding back information of the pixel units disposed at the boundary to a driving unit of the display panel.

12. The display method according to claim 5, wherein the plurality of pixel units are divided into M rows and N columns; and the determining the display region of the display substrate includes:
in a row direction or a column direction, starting from a first row of pixel units or a first column of pixel units at a first side of the pixel region, sequentially lighting up the pixel units in the pixel region row by row or column by column, and detecting an acquired image of the display panel while lighting up the pixel units in the pixel region;
until a bright line appears in the acquired image, determining the pixel units in a row of a column where the bright line is located as a boundary of the pixel region on the first side, and acquiring a row number or a column number of the pixel units disposed at the boundary on the first side;
in the row direction or the column direction, starting from a Mth row or a Nth column at a second side of the pixel region, sequentially lighting up the pixel units in the pixel region row by row or column by column, and detecting an acquired image of the display panel while lighting up the pixel units in the pixel region; and
until a bright line appears in the acquired image, determining the pixel units in a row or a column where the bright line is located as a boundary of the pixel region on the second side, and acquiring a row number or a column number of the pixel units disposed at the boundary on the second side, in which the first side and the second side are two opposite edges of the pixel region.

13. The display method according to claim 12, further comprising:
feeding back information of the pixel units disposed at the boundary to a driving unit of the display panel.

14. The display method according to claim 5, further comprising:
feeding back information of the pixel units disposed at the boundary to a driving unit of the display panel.

15. The display method according to claim 14, further comprising:
acquiring information of the display region of the display panel by a driver chip of the display panel; and
driving the display panel to provide image signals for the pixel units in the display region, so as to display an image.

16. A display device, comprising the display panel according to claim 1.

* * * * *